United States Patent
Breil et al.

(10) Patent No.: US 9,034,749 B2
(45) Date of Patent: May 19, 2015

(54) GATE ELECTRODE WITH STABILIZED METAL SEMICONDUCTOR ALLOY-SEMICONDUCTOR STACK

(71) Applicant: International Business Machines Corporation, Armonk, NY (US)

(72) Inventors: Nicolas L. Breil, Wappingers Falls, NY (US); Cyril Cabral, Jr., Mahopac, NY (US); Martin M. Frank, Dobbs Ferry, NY (US); Claude Ortolland, Peekskill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/024,733

(22) Filed: Sep. 12, 2013

(65) Prior Publication Data

US 2014/0363964 A1   Dec. 11, 2014

Related U.S. Application Data

(63) Continuation of application No. 13/911,669, filed on Jun. 6, 2013.

(51) Int. Cl.
*H01L 21/3205* (2006.01)
*H01L 21/4763* (2006.01)
*H01L 29/423* (2006.01)
*H01L 21/28* (2006.01)
*H01L 29/49* (2006.01)

(52) U.S. Cl.
CPC .... *H01L 29/42372* (2013.01); *H01L 21/28008* (2013.01); *H01L 29/49* (2013.01)

(58) Field of Classification Search
None
See application file for complete search history.

(56) References Cited

U.S. PATENT DOCUMENTS

| 5,624,869 | A  | 4/1997 | Agnello et al. |
| 6,054,744 | A  | 4/2000 | Hu et al. |
| 6,262,458 | B1 | 7/2001 | Hu |

(Continued)

OTHER PUBLICATIONS

Ortolland, C., et al., "Carbon-based thermal stabilization techniques for junction and silicide engineering for high performance CMOS periphery in memory applications", Ultimate Integration of Silicon, Mar. 18-20, 2009, 10th International Conference.

(Continued)

*Primary Examiner* — Angel Roman
(74) *Attorney, Agent, or Firm* — Scully, Scott, Murphy & Presser, P.C.; Louis J. Percello, Esq.

(57) ABSTRACT

A gate structure is provided on a channel portion of a semiconductor substrate. The gate structure may include an electrically conducting layer present on a gate dielectric layer, a semiconductor-containing layer present on the electrically conducting layer, a metal semiconductor alloy layer present on the semiconductor-containing layer, and a dielectric capping layer overlaying the metal semiconductor alloy layer. In some embodiments, carbon and/or nitrogen can be present within the semiconductor-containing layer, the metal semiconductor alloy layer or both the semiconductor-containing layer and the metal semiconductor alloy layer. The presence of carbon and/or nitrogen within the semiconductor-containing layer and/or the metal semiconductor alloy layer provides stability to the gate structure. In another embodiment, a layer of carbon and/or nitrogen can be formed between the semiconductor-containing layer and the metal semiconductor alloy layer.

18 Claims, 7 Drawing Sheets

(56) References Cited

U.S. PATENT DOCUMENTS

| | | | | |
|---|---|---|---|---|
| 6,465,335 | B1* | 10/2002 | Kunikiyo | 438/592 |
| 6,887,774 | B2* | 5/2005 | Hu et al. | 438/591 |
| 7,081,676 | B2 | 7/2006 | Agnello et al. | |
| 2003/0139061 | A1* | 7/2003 | Jeng et al. | 438/775 |
| 2004/0002185 | A1 | 1/2004 | Takahashi | |
| 2005/0104108 | A1* | 5/2005 | Hong | 257/298 |
| 2010/0237440 | A1* | 9/2010 | Ito | 257/408 |
| 2011/0263115 | A1 | 10/2011 | Ganguli et al. | |
| 2012/0241816 | A1 | 9/2012 | Flachowsky et al. | |

OTHER PUBLICATIONS

Seo, S.-C., et al., "Full Metal Gate with Borderless Contact for 14 nm and Beyond", 2011 Symposium on VLSI Technology Digest of Technical Papers, VLSI Technology (VLSIT), Jun. 14-16, 2011.

Tong, Y., et al., "Impact of a Germanium and Carbon Preamorphization Implant on the Electrical Characteristics of NiSi/Si Contacts With a Presilicide Sulfur Implant", IEEE Electron Device Letters, Dec. 2011, vol. 32, No. 12.

U.S. Appl. No. 13/653,679 entitled "Field Effect Transistor Device Having a Hybrid Metal Gate Stack", filed Oct. 17, 2012, First Named Inventor: Cyril Cabral Jr.

Ortolland, C., et al., "New Carbon-Based Thermal Stability Improvement Technique for NiPtSi Used in CMOS Technology", Microelectronic Engineering, May 2011, vol. 88, Issue 5, pp. 578-582, first appeared in The 2010 International workshop on "Materials for Advanced Metallization"—MAM 2010, Mechelen (Malines), Belgium Mar. 7-10, 2010.

Office Action dated Dec. 10, 2014 received in U.S. Appl. No. 13/911,669.

* cited by examiner

GATE ELECTRODE WITH STABILIZED METAL SEMICONDUCTOR ALLOY-SEMICONDUCTOR STACK

CROSS REFERENCE TO RELATED APPLICATION

This application is a continuation of U.S. patent application Ser. No. 13/911,669, filed Jun. 6, 2013 the entire content and disclosure of which is incorporated herein by reference.

BACKGROUND

The present invention relates to semiconductor devices, and more particularly to semiconductor devices including a gate electrode containing a stabilized stack of, from bottom to top, a semiconductor material layer and a metal semiconductor alloy layer, and methods of forming the same.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY

In one aspect of the present invention, semiconductor devices that include a gate electrode containing a stabilized material stack of, from bottom to top, a semiconductor-containing layer and a metal semiconductor alloy layer is provided. In some embodiments, stabilization can occur by incorporating carbon and/or nitrogen within one of the gate electrode layers or both of the semiconductor-containing layer and the metal semiconductor alloy layer. The term "carbon and/or nitrogen" denotes carbon, nitrogen or both carbon and nitrogen. The term "at least one of carbon and nitrogen" can be used interchangeably with the term "carbon and/or nitrogen". In other embodiments, stabilization can occur by providing a layer of carbon and/or nitrogen between the semiconductor-containing layer and the metal semiconductor alloy layer.

In one embodiment, the semiconductor device includes a gate structure present on a channel portion of a semiconductor substrate. The gate structure includes a gate dielectric layer overlaying the channel portion of the semiconductor substrate, an electrically conducting layer present on the gate dielectric layer, a semiconductor-containing layer present on the electrically conducting layer, a metal semiconductor alloy layer present on the semiconductor-containing layer, and a dielectric capping layer overlaying the metal semiconductor alloy layer. In accordance with the present invention, the semiconductor-containing layer, the metal semiconductor alloy layer, or each of the semiconductor-containing layer and the metal semiconductor alloy layer is doped with at least one of carbon and nitrogen (i.e., carbon and/or nitrogen). The semiconductor device of the present invention further includes at least one gate sidewall spacer located adjacent the gate structure and on a surface of the semiconductor substrate. The at least one gate sidewall spacer and the dielectric capping layer encapsulate the metal semiconductor alloy layer within the gate structure.

In another embodiment, the semiconductor device includes a gate structure present on a channel portion of a semiconductor substrate. The gate structure includes a gate dielectric layer overlaying the channel portion of the semiconductor substrate, an electrically conducting layer present on the gate dielectric layer, a semiconductor-containing layer present on the electrically conducting layer, a layer of at least one of carbon and nitrogen (i.e., carbon and/or nitrogen) present on the semiconductor-containing layer, and a metal semiconductor alloy layer present on the layer of at least one of carbon and nitrogen. The semiconductor device of the present invention further includes at least one gate sidewall spacer located adjacent the gate structure and on a surface of the semiconductor substrate. The at least one gate sidewall spacer and the dielectric capping layer encapsulate the metal semiconductor alloy layer within the gate structure.

In another aspect of the present invention, methods are provided for forming semiconductor devices that include a gate electrode containing a stabilized material stack of, from bottom to top, a semiconductor-containing layer and a metal semiconductor alloy layer.

In one embodiment, the method of the present invention includes providing a gate structure on a surface of a semiconductor substrate. The gate structure includes, from bottom to top, a gate dielectric layer, an electrically conducting layer, a semiconductor-containing layer, a metal semiconductor alloy layer, and a dielectric capping layer. The semiconductor-containing layer, the metal semiconductor alloy layer or each of the semiconductor-containing layer and the metal semiconductor layer of the gate structure contains at least one of a carbon dopant and a nitrogen dopant (i.e., a carbon and/or nitrogen dopant). At least one gate sidewall spacer is formed adjacent to the gate structure and on a surface of the semiconductor substrate, wherein the at least one gate sidewall spacer and the dielectric capping layer encapsulate the metal semiconductor alloy layer within the gate structure.

In another embodiment, the method of the present invention includes providing a gate structure on a surface of a semiconductor substrate. The gate structure includes, from bottom to top, a gate dielectric layer, an electrically conducting layer, a semiconductor-containing layer, a layer of at least one of carbon and nitrogen (i.e., carbon and/or nitrogen), a metal semiconductor alloy layer, and a dielectric capping layer. At least one gate sidewall spacer is formed adjacent to the gate structure and on a surface of the semiconductor substrate, wherein the at least one gate sidewall spacer and the dielectric capping layer encapsulate the metal semiconductor alloy layer within the gate structure.

DETAILED DESCRIPTION

The present invention will now be described in greater detail by referring to the following discussion and drawings that accompany the present invention. It is noted that the drawings of the present invention are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present invention. However, it will be appreciated by one of ordinary skill in the art that the various embodiments of the present invention may be practiced without these specific details. In other instances, well-known structures or processing steps have not been described in detail in order to avoid obscuring the present invention. Throughout this application, usage of the term "A and/or B" denotes that A alone, B alone or both A and B are present.

The present invention relates to semiconductor devices and methods of fabricating semiconductor devices, and in some embodiments, to field effect transistor (FET) structures including metal gate technology and high dielectric constant ("high-k") gate dielectrics. As used herein, the term "semiconductor device" means an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure. A field effect transistor (FET) has three terminals, i.e., a functional gate structure, a source region and a drain region. The gate structure controls output current, i.e., flow of carriers in the channel, of a semiconducting device, such as a field effect transistor (FET), through electrical or magnetic fields. The channel is the region between the source region and the drain region of a semiconductor device that becomes conductive when the semiconductor device is turned on.

Typically, the gate structure of a conventional semiconductor device, e.g., field effect transistor (FET), is formed by depositing a layer of silicon oxide ($SiO_2$) or silicon oxynitride ($SiO_xN_y$), constituting a gate insulating layer, upon a semiconductor substrate and then depositing polycrystalline silicon (poly-Si), constituting a gate electrode layer, upon the gate insulator layer. The gate electrode layer and gate insulator layer are then lithographically patterned to form the appropriate shaped gate structure. As conventional field effect transistors have decreased in size, i.e., have been scaled, the thickness of the gate dielectric within the gate structure has also continued to decrease, in order to maintain good electrostatic control of the channel of the field effect transistor. It has been determined that this decreasing thickness has lead to increased leakage currents due to tunneling through the gate dielectric. To further advance field effect transistor scaling and to reduce the leakage currents, high-k dielectric materials (i.e., dielectric materials having a dielectric constant of greater than silicon oxide) have been introduced, along with metal containing gate electrodes. The high k dielectric in general is deposited on a semiconductor substrate with an optional interface layer (i.e., $SiO_2$ or $SiO_xN_y$), and thereafter an electrically conducting layer can be deposited on the high k dielectric to establish the workfunction. On the electrically conducting layer, a semiconductor containing layer can be deposited. Above the semiconductor containing layer, an insulating capping layer is deposited. The stack may then be etched to form the appropriate gate shape and gate sidewall spacers are formed adjacent to the gate structure. Conventionally, the insulating capping layer is then removed, exposing the poly-Si electrode. Removal of the insulating capping layer with an etch process typically degrades the gate sidewalls spacers, which can expose a portion of the conductive features of the gate structure. This degradation of the gate sidewall spacers is typically referred to as gate sidewall spacer pull down.

A salicide process (in which a metal reacts with silicon to form a self-aligned silicide) is typically performed to lower the contact resistance of the gate structure. Silicide formation typically requires depositing a refractory metal, such as Ni, Co or Ti, onto the surface of a Si-containing material or wafer. Following deposition, the structure is then subjected to an annealing step using a thermal anneal process such as, rapid thermal annealing. During thermal annealing, the deposited metal reacts with silicon (Si) forming a metal silicide. It has been discovered that the removal of the insulating capping layer on the poly-Si and the salicide process can both result in gate to source leakage or gate to drain leakage. This leakage comes about due to silicide filaments that can form over the gate sidewall spacers during the salicide processing. Additionally, the gate sidewall spacer pull down effects may expose portions of the conductive features of the gate structure, which can further lead to gate leakage and shorting of the device. Further, it has been determined that when forming a silicide from a salicide process there is a large volume expansion of the preformed gate (typically >5%), which can exacerbate the leakage.

In some embodiments, the methods and semiconductor devices disclosed herein can eliminate the need to form a metal semiconductor alloy, e.g., silicide, on the gate structure following patterning of the gate structure using deposition and anneal processes. In some embodiments, the methods and semiconductor devices disclosed herein can provide thermal stability to a gate structure.

Reference will now be made to FIGS. 1-5 which illustrate an embodiment of the present invention for forming a semiconductor device containing a gate structure which includes a stabilized gate electrode. Although the drawings and description that follow illustrate a single gate structure formed upon a semiconductor substrate, the present invention is not limited to only a single gate structure. Instead, a plurality of gate structures can be formed upon a semiconductor substrate using the methods of the present invention. Also, although the semiconductor devices that are formed in the process sequence depicted in the drawings are field effect transistors (FET), the present invention is not limited to only this type of semiconductor device. For example, the present invention is suitable for use with any semiconductor device including a gate structure having a metal semiconductor alloy present therein. For example, the semiconductor device of the present invention may be a semiconductor nanowire FET or a FinFET.

Figure 1:
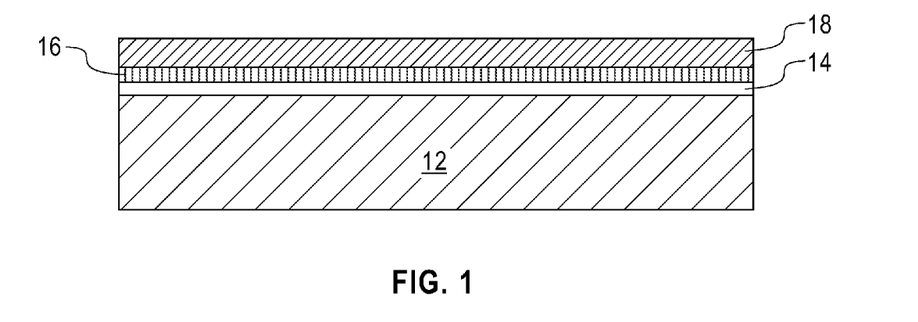
FIG. 1 is a pictorial representation (through a cross sectional view) illustrating an initial gate material stack that is formed on a surface of the semiconductor substrate and that can be employed in one embodiment of the present invention.

Referring first to FIG. 1, there is illustrated an initial gate material stack that can be formed on a surface of a semiconductor substrate 12 in accordance with an embodiment of the present invention. The initial gate material structure includes, from bottom to top, blanket layers of an optional interfacial material 14, a gate dielectric material 16 and an electrically conducting material 18. In the embodiment illustrated, the optional interfacial material 14 is located directly upon the semiconductor substrate 12. When the optional interfacial material 14 is not present, the gate dielectric material 16 can be located directly on the semiconductor substrate 12.

In some embodiments of the present invention, the semiconductor substrate 12 can be a bulk semiconductor substrate. When a bulk semiconductor substrate is employed as semiconductor substrate 12, the bulk semiconductor substrate can be comprised of any semiconductor material including, but not limited to, Si, Ge, SiGe, SiC, SiGeC, InAs, GaAs, InP or other like III/V compound semiconductors. Multilayers of these semiconductor materials can also be used as the semiconductor material of the bulk semiconductor. In one embodiment, the semiconductor substrate 12 can be comprised of a single crystalline semiconductor material, such as, for example, single crystalline silicon. In other embodiments, the semiconductor substrate 12 may comprise a polycrystalline or amorphous semiconductor material.

In another embodiment, a semiconductor-on-insulator (SOI) substrate (not specifically shown) can be employed as the semiconductor substrate 12. Although not specifically shown, one skilled in the art understands that an SOI substrate includes a handle substrate, a buried insulating layer located on an upper surface of the handle substrate, and a semiconductor layer located on an upper surface of the buried insulating layer. In some embodiments, particularly when non-planar devices are being fabricated, the semiconductor layer of the SOI substrate can be processed into an active device region such as, for example, a semiconductor fin or a semiconductor nanowire.

The handle substrate and the semiconductor layer of the SOI substrate may comprise the same, or different, semiconductor material. The term "semiconductor" as used herein in connection with the semiconductor material of the handle substrate and the semiconductor layer denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate and the semiconductor layer. In one embodiment, the handle substrate and the semiconductor layer are both comprised of silicon. In some embodiments, the handle substrate is a non-semiconductor material including, for example, a dielectric material and/or a conductive material.

The handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present invention. The handle substrate and/or the semiconductor layer of the SOI substrate may be a single crystalline semiconductor material, a polycrystalline material, or an amorphous material. Typically, at least the semiconductor layer is a single crystalline semiconductor material. In some embodiments, the semiconductor layer that is located atop the buried insulating layer can be processed to include semiconductor regions having different crystal orientations.

The buried insulating layer of the SOI substrate may be a crystalline or non-crystalline oxide or nitride. In one embodiment, the buried insulating layer is an oxide. The buried insulating layer may be continuous or it may be discontinuous. When a discontinuous buried insulating region is present, the insulating region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of the semiconductor layer of the SOI substrate is typically from 100 Å to 1000 Å, with a thickness from 500 Å to 700 Å being more typical. In some embodiments, and when an ETSOI (extremely thin semiconductor-on-insulator) substrate is employed, the semiconductor layer of the SOI has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above. The buried insulating layer of the SOI substrate typically has a thickness from 10 Å to 2000 Å, with a thickness from 1000 Å to 1500 Å being more typical. The thickness of the handle substrate of the SOI substrate is inconsequential to the present invention.

In some other embodiments, hybrid semiconductor substrates which have different surface regions of different crystallographic orientations can be employed as semiconductor substrate 12. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

Semiconductor substrate 12 may be doped, undoped or contain doped and undoped regions therein. For clarity, the doped regions are not specifically shown in the drawings of the present invention. Each doped region within the semiconductor material may have the same, or they may have different conductivities and/or doping concentrations. The doped regions that are present in the semiconductor substrate 12 are typically referred to as well regions and they are formed utilizing a conventional ion implantation process or gas phase doping.

In some embodiments, (not particularly shown), the semiconductor substrate 12 can be processed to include at least one isolation region therein. The at least one isolation region can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. Note that the at least one isolation region may provide isolation between neighboring gate structure regions, typically required when the neighboring gate structure have opposite conductivities, i.e., nFETs and pFETs. As such, the at least one isolation region can separate an nFET device region from a pFET device region.

The initial structure shown in FIG. 1 further includes a blanket layer of an optional interfacial material 14. The term "blanket" as used throughout the present application denotes that a material layer covers an entirety of an underlying material layer. The optional interfacial material 14 can be formed utilizing a thermal process such as, for example, thermal oxidation. In some embodiments, a wet chemical oxidation process can be used in forming the optional interfacial material 14. While the optional interfacial material 14 is typically formed prior to forming the blanket layer of gate dielectric material 16, it is possible to form the optional interfacial material 14 after forming the gate dielectric material 16. In some embodiments, the optional interfacial material 14 can be composed of silicon oxide, silicon oxynitride and/or a nitrided silicon oxide. The thickness of the optional interfacial material 14 may be from 0.3 nm to 2 nm, although other thicknesses that are below 0.3 nm and up to 4 nm can be used as for the optional interfacial material 14.

Gate dielectric material 16 can then be formed on an exposed surface of either the semiconductor substrate 12 or the optional interfacial material 14. In some embodiments of the present invention, the gate dielectric material 16 may be composed of any dielectric material including oxide, nitride and/or oxynitride containing dielectrics. For example, when the gate dielectric material 16 is composed of an oxide, the gate dielectric material 16 may be composed of silicon oxide ($SiO_2$). In another example, the gate dielectric material 16 may be composed of a high-k dielectric material. The term "high-k" denotes a material having a dielectric constant that is greater than the dielectric constant of silicon oxide ($SiO_2$). For example, a high-k dielectric material typically has a dielectric constant that is greater than 3.9. In another example, a high-k dielectric material that may be employed for the gate dielectric material has a dielectric constant that is greater than 10. In yet another embodiment, the high-k gate dielectric material may have a dielectric constant ranging from 10 to 30. The dielectric constants mentioned herein are relative to a vacuum at room temperature, i.e., 20° C. to 25° C.

Exemplary high k dielectrics that can be used for the gate dielectric material 16 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and/or an alloy thereof. Each value of x is independently from 0.5 to 3 and each value of y is independently from 0 to 2. In some embodiments, a multilayered gate dielectric structure comprising different gate dielectric materials, e.g. silicon oxide, and a high k gate dielectric can be used as the gate dielectric material 16.

In some embodiments, the gate dielectric material 16 can be formed by a deposition technique including, for example, chemical vapor deposition (CVD), plasma enhanced chemical vapor deposition (PECVD), physical vapor deposition (PVD), sputtering, or atomic layer deposition (ALD). In other embodiments, the gate dielectric material 16 can be formed by a thermal process such as, for example, thermal oxidation. In yet another embodiment, any combination of deposition and/or thermal processing can be employed in forming the gate dielectric material 16. In one embodiment of the present invention, the gate dielectric material 16 can have a thickness in a range from 1 nm to 10 nm. Other thicknesses that are lesser than or greater than the aforementioned thickness range can also be employed for the gate dielectric material 16.

The initial gate material stack also includes an electrically conducting material 18 located on an exposed surface of the gate dielectric material 16. The electrically conducting material 18 can also be referred to herein as a workfunction metal material. Some examples of suitable materials for the electrically conducting material 18 include titanium nitride (TiN), tantalum nitride (TaN), titanium silicon nitride (TiSiN), tantalum silicon nitride (TaSiN), titanium carbide (TiC), tantalum carbide (TaC or $Ta_2C$) or combinations thereof. In some embodiments, the base material for the electrically conducting material 18 may be doped with at least one of La, Al, and Dy to further effectuate an effective workfunction shift. The electrically conducting material 18 may be deposited using physical vapor deposition (PVD), chemical vapor deposition (CVD), sputtering or atomic layer deposition (ALD) processes. The thickness of the electrically conducting material 18 may range from 0.5 nm to 10 nm, although other thicknesses that are lesser than or greater than the aforementioned thickness range can also be employed for the electrically conducting material 18.

The electrically conducting material 18 may be an n-type workfunction metal material or a p-type workfunction metal material that is incorporated into a gate structure as a means to adjust the threshold voltage of the corresponding semiconductor device. As used herein, an "n-type workfunction metal material" is a metal containing material that effectuates an n-type (i.e., negative) threshold voltage shift, i.e., a threshold voltage shift that results in a negative threshold voltage shift. As used herein, "threshold voltage" is the lowest attainable gate voltage that will turn on a semiconductor device, e.g., transistor, by making the channel of the device conductive. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the effective workfunction of the n-type workfunction metal material ranges from 4.1 eV to 4.3 eV.

As used herein, a "p-type workfunction metal material" is a metal containing layer that effectuates a p-type (i.e., positive) threshold voltage shift. In one embodiment, the effective workfunction of the p-type workfunction metal material ranges from 4.9 eV to 5.2 eV. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one example, the electrically conducting material 18 is an n-type workfunction metal material which may be composed of at least one of TiN, HfN, and HfSi. The n-type workfunction metal material can be deposited using chemical vapor deposition (CVD), atomic layer deposition (ALD), sputtering or plating. In one embodiment, the n-type workfunction metal layer comprises TiN, and is deposited using sputtering. In one example, an n-type workfunction metal material composed of TiN can be sputtered from a solid titanium target, in which the nitrogen content of the metal nitride layer is introduced by a nitrogen gas. In another example, an n-type workfunction metal material comprising TiN can be sputtered from a solid target comprised of titanium and nitrogen. In one embodiment, the thickness of the n-type workfunction metal layer may range from 0.5 nm to 10 nm. In another embodiment, the thickness of the n-type workfunction metal layer may range from 0.5 nm to 2 nm.

In another example, the electrically conducting material 18 is a p-type workfunction metal material which may be composed of TiN. In some embodiments, when TiN is used for both a p-type workfunction metal material and an n-type workfunction metal material, effective workfunction tuning may be provided by doping the TiN. For example, La dopant may provide for effective workfunction tuning in the TiN for the p-type workfunction metal material, and Al dopant may provide for the effective workfunction tuning in the TiN for the n-type workfunction metal material. The p-type workfunction metal material may also be composed of TiAl, TiAlN, Ru, Pt, Mo, Co or alloys and combinations thereof. In one embodiment, the p-type workfunction metal material can comprise titanium and aluminum which may be deposited by a physical vapor deposition (PVD) method, such as sputtering. In one embodiment, the thickness of the p-type workfunction metal material may range from 0.5 nm to 10 nm. In another embodiment, the thickness of the p-type workfunction metal material may range from 0.5 nm to 2 nm.

Figure 2:
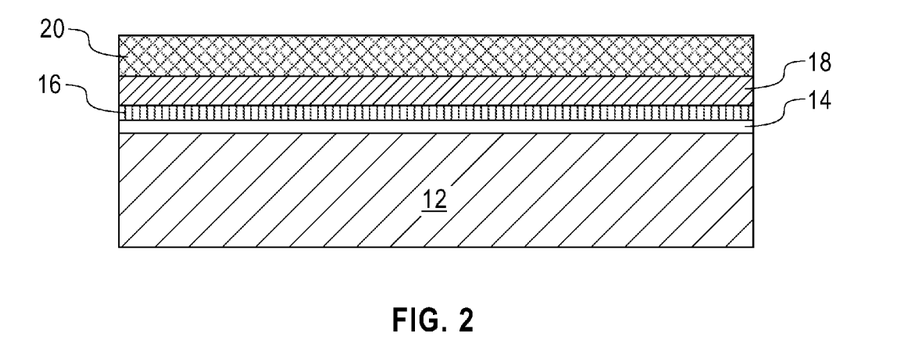
FIG. 2 is a pictorial representation (through a cross sectional view) illustrating the structure of FIG. 1 after forming a semiconductor-containing material that is doped with carbon and/or nitrogen on an upper exposed surface of the initial gate material stack in accordance with an embodiment of the present invention.

Referring now to FIG. 2, there is illustrated the structure of FIG. 1 after forming a semiconductor-containing material 20 that is doped with carbon and/or nitrogen on an upper exposed surface of the initial gate material stack in accordance with an embodiment of the present invention. The semiconductor-containing material 20 that is doped with carbon and/or nitrogen can be referred to herein as a "carbon-doped and/or nitrogen-doped semiconductor-containing material" or a "semiconductor-containing material doped with carbon and/or nitrogen". The semiconductor-containing material 20 is formed as a blanket layer on the exposed surface of the electrically conducting material 18.

In some embodiments, the semiconductor-containing material 20 is doped with carbon. In other embodiments, the semiconductor-containing material 20 is doped with nitrogen. In yet further embodiments, the semiconductor-containing material 20 is doped with both carbon and nitrogen. In one embodiment, the semiconductor-containing material 20 can be amorphous or polycrystalline. In yet another embodiment, the semiconductor-containing material 20 may be crystalline.

In addition to including carbon and/or nitrogen as a dopant atom, the semiconductor-containing material 20 may be composed of a semiconductor material. For example, the semiconductor-containing material 20 may be a silicon-containing material. Examples of silicon-containing materials that are suitable for the semiconductor-containing material 20 include, but are not limited to, silicon (Si), single crystal silicon, polycrystalline silicon, amorphous silicon, or the above-mentioned silicon-containing materials with some or all of the Si replaced by Ge. Other examples of semiconductor materials that are suitable for the semiconductor-containing material 20 include GaSb, GaP, GaAs, InAs, InP, and all other III-V or II-VI compound semiconductors. In some embodiments, semiconductor-containing material 20 may also include arsenic (As), phosphorus (P) or boron (B) which impurities may improve the electrical conductivity of the gate structure to be formed.

In one embodiment, the semiconductor-containing material 20 that is doped with carbon and/or nitrogen can be formed utilizing an in-situ deposition process. By "in-situ deposition process" it is meant that the carbon and/or nitrogen impurity is(are) present during the initial deposition of the semiconductor-containing material. For example, a carbon dopant source and/or a nitrogen dopant source can used in conjunction with a semiconductor source material during the formation of the semiconductor-containing material 20 that is doped with carbon and/or nitrogen. Examples of carbon sources that can be employed in the present invention include, but are not limited to, $C_2H_2$ (acetylene), $C_2H_4$ (ethylene), $CH_3CH_2OH$ (ethanol), $CH_4$ (methane) and/or other carbon containing gasses. Examples of nitrogen sources include, but are not limited to, $N_2$, $NH_3$ (ammonia) and/or other nitrogen containing gasses. The semiconductor source material may include any well known semiconductor source material such as, for example, a silane. The in-situ deposition process may be performed by chemical vapor deposition (CVD), plasma enhanced chemical vapor deposition, or physical vapor deposition.

In another embodiment, the semiconductor-containing material 20 that is doped with carbon and/or nitrogen can be formed by first depositing a non-carbon and/or non-nitrogen doped semiconductor-containing material and then introducing carbon and/or nitrogen into the non-carbon and/or non-nitrogen doped semiconductor-containing material. In one embodiment of the present invention, the carbon and/or nitrogen can be introduced into a non-carbon and/or non-nitrogen doped semiconductor-containing material by ion implantation. In another embodiment of the present invention, the carbon and/or nitrogen can be introduced into a non-carbon and/or non-nitrogen doped semiconductor-containing material by plasma immersion. In yet another embodiment of the present invention, the carbon and/or nitrogen can be introduced into a non-carbon and/or non-nitrogen doped semiconductor-containing material by a cluster ion beam process.

Notwithstanding the technique employed in forming the semiconductor-containing material 20 that is doped with carbon and/or nitrogen, and in one embodiment of the present invention, the content of carbon and/or nitrogen that can be present in semiconductor-containing material 20 is from 0.01 atomic percent to 10 atomic percent. In another embodiment of the present invention, the content of carbon and/or nitrogen that can be present in semiconductor-containing material 20 is from 0.1 atomic percent to 3 atomic percent.

The thickness of semiconductor-containing material 20 that is doped with carbon and/or nitrogen can be from 1 nm to 50 nm. Other thicknesses that are lesser than or greater than the aforementioned thickness range may also be employed for semiconductor-containing material 20.

Figure 3:
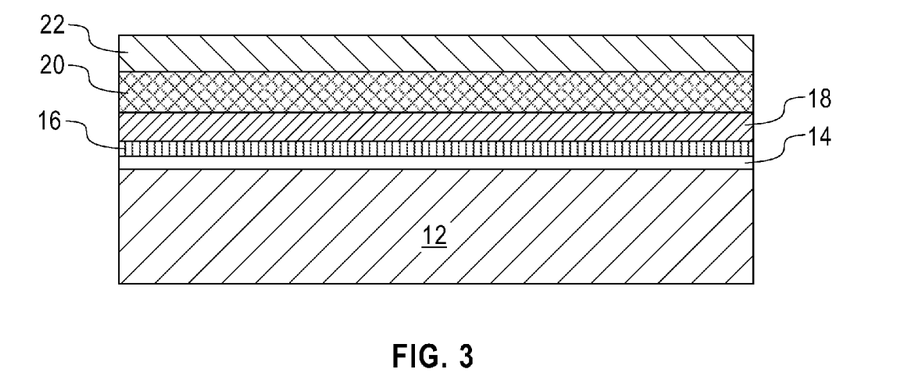
FIG. 3 is a pictorial representation (through a cross sectional view) illustrating the structure of FIG. 2 after forming a metal semiconductor alloy material on an exposed surface of the semiconductor-containing material that is doped with carbon and/or nitrogen in accordance with an embodiment of the present invention.

Referring now to FIG. 3, there is illustrated the structure of FIG. 3 after forming a metal semiconductor alloy material 22 on an exposed surface of the semiconductor-containing material 20 that is doped with carbon and/or nitrogen in accordance with an embodiment of the present invention. The metal semiconductor alloy material 22 is formed as a blanket layer on the exposed surface of the semiconductor-containing material 20.

The term "metal semiconductor alloy" denotes a substance with metallic properties, composed of two or more chemical elements of which at least one is a metal and another is a semiconductor. As used herein, "metallic" is a material with electrically conductive properties. In some embodiments, the electrically conductive properties of the metal semiconductor alloy material 22 include a sheet resistance of less than 50 Ohm/square. In one example, the sheet resistance of the metal semiconductor alloy material 22 is less than 25 Ohm/square. In another example, the sheet resistance of the metal semiconductor alloy material 22 ranges from 10 Ohm/square to 20 Ohm/square.

Some examples of compositions that are suitable for the metal semiconductor alloy material 22 include, but are not limited to, tungsten silicide ($WSi_x$), titanium silicide ($TiSi_x$), tantalum silicide ($TaSi_x$), niobium silicide ($NbSi_x$), or vanadium silicide ($VSi_x$), wherein x ranges from 1.6 to 2.4. In one example, the metal semiconductor alloy material 22 may be composed of $TiSi_x$, with x ranging from 1.60 to 1.99. In one example, the metal semiconductor alloy material 22 is comprised of $TiSi_x$ with x ranging from 2.01 to 2.40. The metal semiconductor alloy material 22 may be composed of a material comprised of $TiSi_x$ with inclusion of up to 10 atomic percent Ta or Nb. The aforementioned compositions are provided for illustrative purposes only and are not intended to limit the present invention. The thickness of the metal semiconductor alloy material 22 may range from 5 nm to 100 nm. Other thicknesses that are lesser than or greater than the aforementioned thickness range can also be used for the metal semiconductor alloy material 22.

The aforementioned metal semiconductor alloy materials 22 may have a thermal stability that can withstand the temperatures of the activation anneal for the later formed source and drain regions. The term "thermal degradation" refers to changes in the thermally stable semiconductor alloy that take place above a specific temperature, making it no longer thermally stable. These changes can result in an increase of resistivity, a change in shape and a change in the compositional homogeneity. Measurements of sheet resistance and physical structure (i.e. XSEM and XTEM) can reveal these changes. For example, the above described metal semiconductor alloy materials may be thermally stable at temperatures greater than 900° C. In another example, the above described metal semiconductor alloy materials 22 may be thermally stable at temperatures greater than 950° C., and in some examples may be thermally stable to temperatures as great as 1000° C. (i.e. Ti(4.5 at. % Ta)$Si_{2.3}$ semiconductor alloy). It is noted that other compositions for the metal semiconductor alloy material 22 are within the scope of the present invention, so long as the composition of the metal semiconductor alloy material 22 can withstand temperatures of 900° C. or higher, such as 950° C. or higher.

By providing enhanced thermal stability to temperatures of 900° C. or greater, the metal semiconductor alloy material 22 may be subjected to the activation anneal for the source and drain regions without effectuating a thermal degradation of the metal semiconductor alloy material 22 within the gate structure. Therefore, because the shape and compositional homogeneity of the metal semiconductor alloy material 22 is not impacted by the activation anneal, the metal semiconductor alloy material 22 of the gate structure will have the same shape after the activation anneal that it had before the activation anneal. Any change, i.e., shape change, of the metal semiconductor alloy material 22 during the later described activation anneal of the source and drain regions should be less than 5%.

The metal semiconductor alloy material 22 can be formed by a deposition method, which co-deposits the metal elements and the semiconductor elements of the metal semiconductor alloy material 22 simultaneously. Co-deposition of the metal and semiconductor elements of the metal semiconductor alloy material 22 is differentiated from depositing a metal layer on a previously formed semiconductor surface and annealing the deposited metal and semiconductor surface to promote co-diffusion of the metal and semiconductor elements to form a silicide, such as practiced in salicide processing. Co-deposition of the metal elements and the semiconductor elements of the metal semiconductor alloy material 22 may be provided by physical vapor deposition (PVD), chemical vapor deposition (CVD) or atomic layer deposition (ALD).

In one embodiment, co-deposition of the semiconductor elements and the metal elements of the metal semiconductor alloy material 22 is provided by a dual target sputtering apparatus. In a dual target sputtering system, there are two targets composed of target material. The first target may provide the metal source and the second target may provide a silicon source. The first and second targets may both be charged, e.g., negatively charged, and may be referred to as a cathode. The deposition surface is typically charged opposite, e.g., positively charged, the first and second targets, and is typically referred to as an anode.

In one example, if the desired composition of the metal semiconductor alloy material 22 is tungsten silicide ($WSi_x$) the dual target sputtering apparatus would contain one target composed of tungsten (W) and another target composed of silicon (Si). In another example and when the desired composition of the metal semiconductor alloy material 22 is tantalum silicon or titanium silicon, one of the two targets will be composed of the metal, such as tantalum or titanium, and the other target will be composed of silicon.

In another embodiment, sputter deposition of the co-deposited metal and semiconductor elements for the metal semiconductor alloy material 22 is provided from a single target. For example, when the desired composition of the metal semiconductor alloy material 22 is titanium silicide ($TiSi_x$) the single target sputtering apparatus would contain one target having a titanium silicide ($TiSi_x$) composition that is desired to be deposited. In another example when the desired composition of the metal semiconductor alloy material 22 is tungsten silicide ($WSi_x$), the single target sputtering apparatus would contain one target having a tungsten silicide ($WSi_x$) composition that is desired to be deposited. In another example and when the desired composition of the metal semiconductor alloy material 22 is tantalum silicide, the single target sputtering apparatus would contain one target having a tantalum composition that is desired to be deposited. Similar to the dual sputtering system, in a single target sputtering system, the single target may be negatively charged, and may be referred to as a cathode, while the deposition surface is positively charged, and is typically referred to as an anode.

In another embodiment, the metal and semiconductor elements may be co-deposited using chemical vapor deposition (CVD). To provide for co-deposition of the metal and semiconductor elements for the metal semiconductor alloy material 22, the chemical vapor deposition (CVD) method may include two gas precursors, in which one gas precursor can provide the semiconductor element and the second gas precursor can provide the metal element. For example, when the semiconductor element is silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. Examples of gas precursors for the metal element of the metal semiconductor alloy may include orgometallic compounds or complexes such as, for example, $TiCl_4$, $TaCl_4$, $MoCl_5$, $WF_6$, or $Ni(Co)_4$.

In another embodiment, the metal and semiconductor elements may be co-deposited using atomic layer deposition (ALD). Atomic layer deposition (ALD) uses sequential self-limiting surface reactions to deposit material layers in the monolayer thickness regime. Atomic layer deposition (ALD) is similar in chemistry to chemical vapor deposition (CVD), except that the atomic layer deposition (ALD) reaction breaks the chemical vapor deposition reaction into two half-reactions, keeping the precursor materials separate during the reaction. Due to the characteristics of self-limiting and surface reactions, atomic layer deposition film growth makes atomic scale deposition control possible. By keeping the precursors separate throughout the coating process, atomic layer control of film growth can be obtained as fine as ~0.1 Å per cycle. Separation of the precursors is accomplished by pulsing a purge gas (typically nitrogen or argon) after each gas precursor pulse to remove excess precursor from the deposition chamber of the atomic layer deposition apparatus.

The above described deposition methods are provided for illustrative purposes only and are not intended to limit the present invention. The metal semiconductor alloy material 22 may be deposited using any method that allows for co-deposition of the metal and semiconductor elements on the deposition surface substantially simultaneously.

Figure 4:
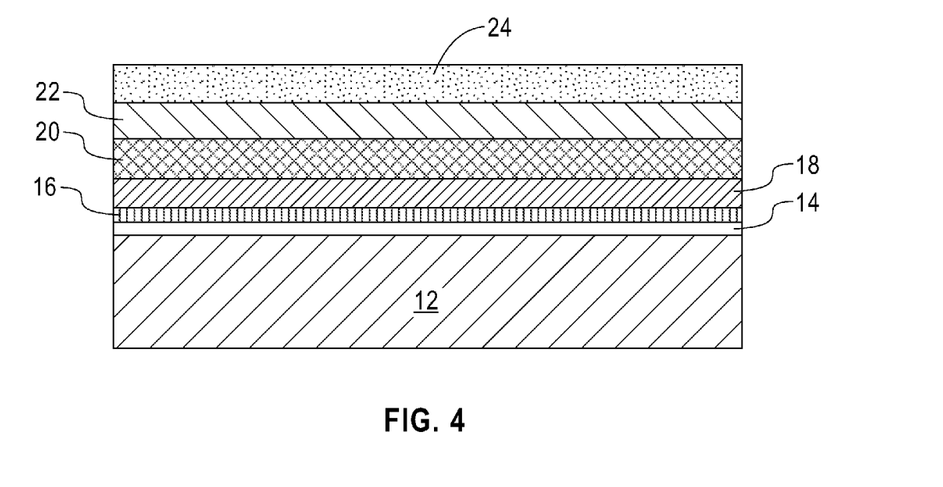
FIG. 4 is a pictorial representation (through a cross sectional view) illustrating the structure stack of FIG. 3 after forming a dielectric capping material on an exposed surface of the metal semiconductor alloy material in accordance with an embodiment of the present invention.

Referring now to FIG. 4, there is illustrated the structure of FIG. 3 after forming a dielectric capping material 24 on an exposed surface of the metal semiconductor alloy material 22 in accordance with an embodiment of the present invention. The dielectric capping material 24 is formed as a blanket layer on the exposed surface of the metal semiconductor alloy material 22.

The dielectric capping material 24 may be composed of any dielectric material including oxides, nitrides, and/or oxynitrides. For example, the dielectric capping material 24 may be selected from silicon-containing materials, such as $SiO_2$, $Si_3N_4$, $SiO_xN_y$, SiC, SiCO, SiCOH, and/or SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and/or diamond-like carbon (DLC, also known as amorphous hydrogenated carbon, α-C:H). In some embodiments, the dielectric capping material 24 may be silicon oxide ($SiO_2$), silicon nitride ($Si_3N_4$), silicon oxynitride ($SiO_xN_y$), aluminum oxide ($Al_2O_3$), hafnium oxide ($HfO_2$), zirconium oxide ($ZrO_2$) or combinations and multi-layers thereof. Other dielectric layers have also been contemplated for the dielectric capping material 24. In one embodiment, the dielectric capping material 24 may have a thickness ranging from 5 nm to 100 nm; although other thicknesses that are lesser than or greater than this thickness range can also be employed for the dielectric capping material 24.

The dielectric capping material 24 may be formed using a deposition process, such as, for example, chemical vapor deposition (CVD), plasma enhanced chemical vapor deposition, metal-organic chemical vapor deposition, evaporation, chemical solution deposition, spin on deposition, or physical vapor deposition (PVD).

Figure 5:
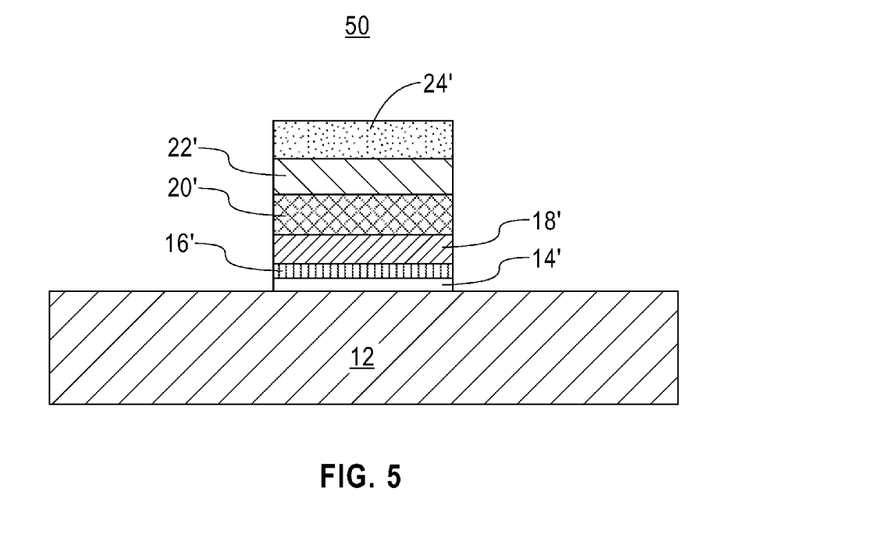
FIG. 5 is a pictorial representation (through a cross sectional view) illustrating the structure of FIG. 4 after patterning the gate material stack to provide a gate structure overlying a portion of the semiconductor substrate in accordance with an embodiment of the present invention.

Referring now to FIG. 5, there illustrated the structure of FIG. 4 after patterning the gate material stack which includes the optional interfacial material 14, the gate dielectric material 16, the electrically conducting material 18, the semiconductor-containing material 20, the metal semiconductor alloy material 22, and the dielectric capping material 24. The patterning provides a gate structure 50 overlying a portion of the semiconductor substrate 12 in accordance with an embodiment of the present invention. The gate structure 50 includes remaining portions of the optional interfacial material 14, the gate dielectric material 16, the electrically conducting material 18, the semiconductor-containing material 20, the metal semiconductor alloy material 22, and the dielectric capping material 24. The remaining portion of the optional interfacial material 14 is referred hereinafter as optional interfacial layer 14'. The remaining portion of the gate dielectric material 16 is referred hereinafter as gate dielectric layer 16', the remaining portion of the electrically conducting material 18 is hereinafter referred to as electrically conducting layer 18', the remaining portion of the semiconductor-containing material 20 is hereinafter referred to as semiconductor-containing layer 22', the remaining portion of the metal semiconductor alloy material 22 is hereinafter referred to as metal semiconductor alloy layer 22', and the remaining portion of the dielectric capping material 24 is hereinafter referred to as dielectric capping layer 24'. As shown in the drawings, each of elements 14', 16', 18', 20', 22' and 24, of gate structure 50 have sidewalls which are vertically coincident to each other.

In some embodiments, the gate structure 50 may be patterned using photolithography (or lithography for short) and etching. More specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. The term "selective" in reference to a material removal process denotes that the rate of material removal for a first material is greater than the rate of removal for at least another material of the structure to which the material removal process is being applied. The patterned resist is then removed using an $O_2$ ash process, or the patterned resist may be stripped using a wet chemical process.

Figure 6:
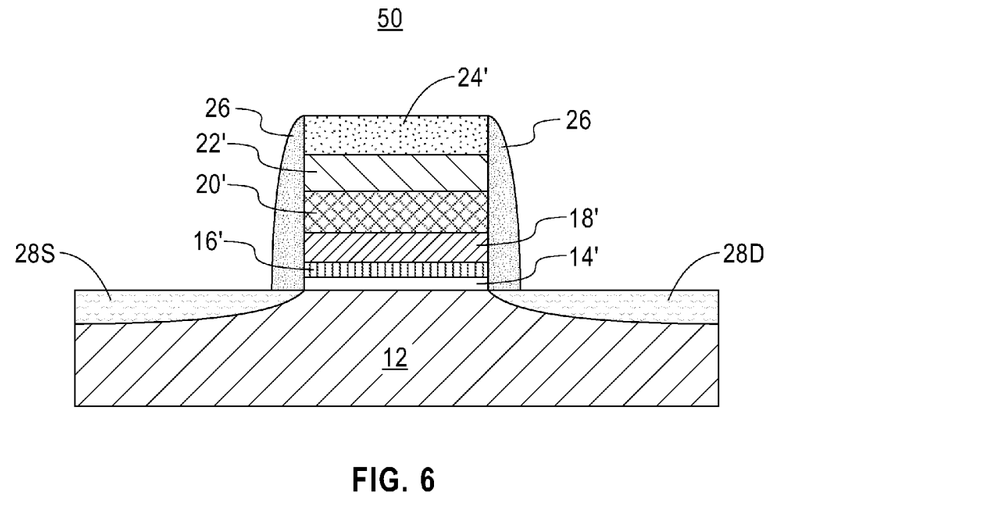
FIG. 6 is a pictorial representation (through a cross sectional view) illustrating the structure of FIG. 5 after forming at least one gate spacer adjacent the gate structure and forming a source region on one side of the gate structure and a drain region on opposite side of the gate structure in accordance with an embodiment of the present invention.

Referring now to FIG. 6, there is illustrated the structure of FIG. 5 after forming at least one gate spacer 26 adjacent the gate structure 50 and forming a source region 28S on one side of the gate structure and a drain region 28D on opposite side of the gate structure 50 in accordance with an embodiment of the present invention.

The one gate spacer 26 may be formed on the sidewall of the gate structure 50 using deposition and etch processes. In one embodiment, the at least one gate spacer 26 has a width, as measured at the base of the at least one gate spacer 26, ranging from 3 nm to 40 nm. The width of the at least one gate spacer 26 may taper, i.e., may reduce, in the direction from the semiconductor substrate 12 towards the upper surface of the gate structure 50. The at least one gate spacer 26 may be comprised of a dielectric material, such as a nitride, e.g., silicon nitride. In one embodiment, the at least one gate spacer 26 may be comprised of a low-k dielectric material, which typically has a dielectric constant that is less than 4.0, e.g., 3.9. In another embodiment, the at least one gate spacer 26 is comprised of a low-k dielectric material having a dielectric constant ranging from 1.75 to 3.5. Examples of materials suitable for low-k dielectric spacers include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), or combinations thereof.

The height of the at least one gate spacer 26 extends from the upper surface of the semiconductor substrate 12 to at least beyond the lower surface of the dielectric capping layer 24'. In some embodiments, the upper surface of the at least one gate spacer 26 is substantially coplanar with the upper surface of the dielectric capping layer 24'.

The at least one gate spacer 26 in combination with the dielectric capping layer 24' of the gate structure 50 encapsulates the metal semiconductor alloy layer 22' of the gate structure 50. By "encapsulate" it is meant that the at least one gate spacer 26 and the dielectric capping layer 24' contain the metal semiconductor alloy layer 22' within the width and height of the gate structure 50 so that the metal semiconductor alloy layer 22' can not extend beyond the dimensions of the gate structure 50. In some embodiments, by encapsulating the metal semiconductor alloy layer 22' with the dielectric capping layer 24' and the at least one gate spacer 26, the methods and structures disclosed herein reduce, if not eliminate, shorting of the metal semiconductor alloy layer 22' to the subsequently formed source and drain regions.

After forming the at least one gate spacer 26, a source region 28S and a drain region 28D are formed in the semiconductor substrate 12 on opposing sides of the gate structure 50. A drain region 28D is a doped region in semiconductor device that is located at one end of the channel, in which carriers are flowing out of the transistor. A source region 28S is a doped region in the semiconductor device that is located on the other end of the channel in which majority carriers are flowing into the channel. The channel is the region underlying the gate structure 50 and between the source region 28S and the drain region 28D of the semiconductor device that becomes conductive when the semiconductor device is turned on. In one embodiment, the source and drain regions 28S, 28D of the semiconductor device may include extension source and drain regions, deep source and drain regions, and halo regions. The source and drain regions 28S, 28D may be formed using an ion implantation process.

In some embodiments (not shown), metal semiconductor alloy contacts, such as silicide contacts, may be formed on an upper surface of the source region 28S and the drain region 28D. In one embodiment, a silicon-containing metal semiconductor alloy contacts may be formed by depositing a refractory metal, such as Co, Ni or Ti, onto the surface of the source region 28S and/or drain region 28D. Following deposition, the structure is then subjected to an annealing step using conventional processes such as, but not limited to, rapid thermal annealing. During thermal annealing, the deposited metal reacts with silicon forming a metal silicide. The portions of the refractory metal that are not deposited on a semiconductor are not converted to a metal semiconductor alloy, and may be removed by selective etching.

The source and drain regions 28S, 28D, may be activated by an annealing process including, but not limited to, rapid thermal anneal. Rapid thermal annealing can be carried out using a temperature ranging from 750° C. to 1200° C. for a time period of about 1.0 second to about 20.0 seconds. In one example, the annealing temperature used in activating the source and drain regions 28S, 28D is 950° C. or above, and the annealing time is typically about 5 seconds or below. The composition of the metal semiconductor alloy layer 22' within the gate structure 50 is thermally stable within the above-mentioned temperatures for the activation anneal of the source and drain regions 28S, 28D. Because the metal semiconductor alloy layer 22' is thermally stable, the metal semiconductor alloy layer 22' does not experience a shape change during the activation anneal. For example, the shape change of the metal semiconductor alloy layer 22' during the activation anneal is limited to 5% or less. In yet another example, there is no shape change of the metal semiconductor layer 22 during the activation anneal.

Figure 7:
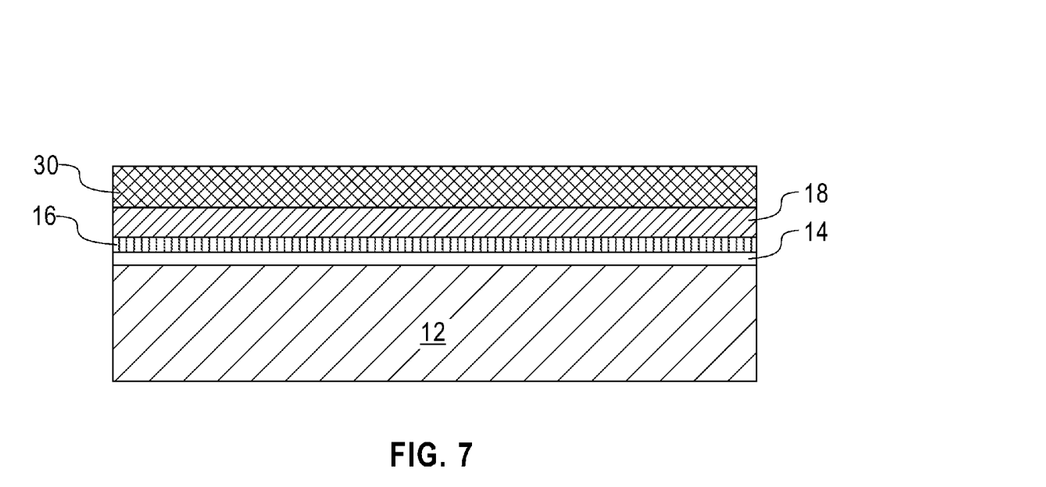
FIG. 7 is a pictorial representation (through a cross sectional view) illustrating the structure of FIG. 1 after forming a non-carbon and/or non-nitrogen doped semiconductor-containing material on an exposed surface of the initial gate material stack in accordance with an embodiment of the present invention.

Reference is now made to FIGS. 7-10 which illustrate another embodiment of the present invention. In this embodiment, carbon and/or nitrogen impurity is present in the metal semiconductor alloy layer of a gate structure. Referring first to FIG. 7, there is illustrated the structure of FIG. 1 after forming a non-carbon and/or non-nitrogen doped semiconductor-containing material 30 on an exposed surface of the initial gate material stack in accordance with an embodiment of the present invention. Specifically, the non-carbon and/or non-nitrogen doped semiconductor-containing material 30 is formed on an exposed surface of the electrically conducting material 18.

The non-carbon and/or non-nitrogen doped semiconductor-containing material 30 is similar to the semiconductor-containing material 20 described above except that carbon, nitrogen, or both carbon and nitrogen is(are) not introduced into the semiconductor-containing material. As such, the various semiconductor materials mentioned above for semiconductor-containing material 20 can be used herein as non-carbon and/or non-nitrogen doped semiconductor-containing material 30. Also, the thickness of non-carbon and/or non-nitrogen doped semiconductor-containing material 30 can be within the thickness range mentioned above for semiconductor-containing material 20. The non-carbon and/or non-nitrogen doped semiconductor-containing material 30 can be formed by deposition including those mentioned above for semiconductor-containing material 20 although no carbon and/or nitrogen impurity is used during or after the formation of the semiconductor-containing material.

Figure 8:
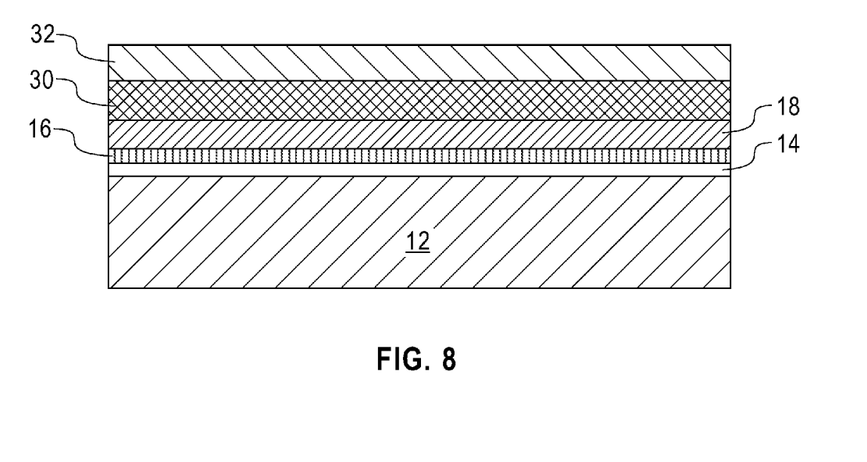
FIG. 8 is a pictorial representation (through a cross sectional view) illustrating the structure of FIG. 7 after forming a metal semiconductor alloy layer that is doped with carbon and/or nitrogen on an exposed surface of the non-carbon and/or non-nitrogen doped semiconductor-containing material in accordance with an embodiment of the present invention.

Referring now to FIG. 8, there is illustrated the structure of FIG. 7 after forming metal semiconductor alloy material 32 that is doped with carbon and/or nitrogen on an exposed surface of the non-carbon and/or non-nitrogen doped semiconductor-containing material 30 in accordance with an embodiment of the present invention. The metal semiconductor alloy material 32 that is doped with carbon and/or nitrogen can also be referred to herein as a carbon and/or nitrogen doped metal semiconductor alloy material.

The metal semiconductor alloy material 32 includes in addition to carbon and/or nitrogen dopant, a metal and semiconductor. The metal semiconductor alloy material 32 can be formed utilizing one of the techniques mentioned above with the exception that during the co-deposition process a carbon and/or nitrogen source, including a carbon and/or nitrogen target, can be used. The carbon and/or nitrogen target can be used as a separate target or it can be combined with a target that also includes a metal semiconductor alloy. In one embodiment, the concentration carbon and/or nitrogen with the metal semiconductor alloy material 32 can be from 0.01 atomic percent to 10 atomic percent. In another embodiment, the concentration carbon and/or nitrogen with the metal semiconductor alloy material 32 can be from 0.1 atomic percent to 3 atomic percent. The metal semiconductor alloy material 32 can have a thickness with the range mentioned above for metal semiconductor alloy material 22.

Figure 9:
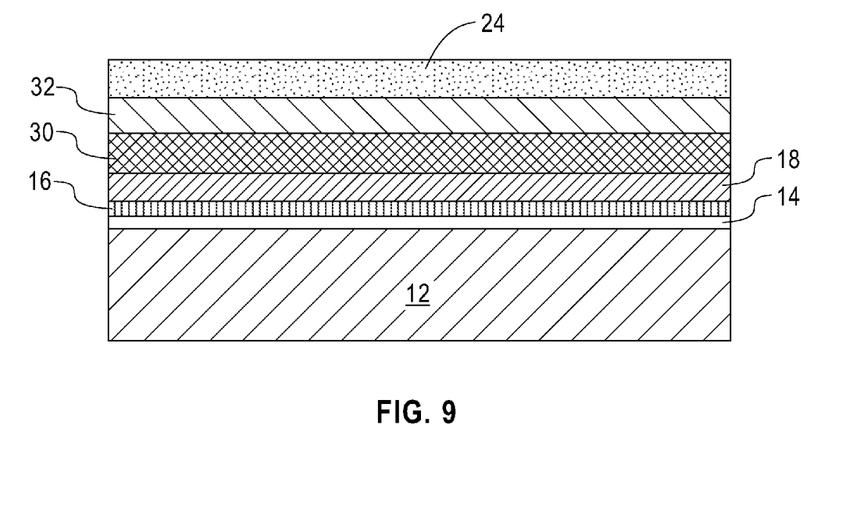
FIG. 9 is a pictorial representation (through a cross sectional view) illustrating the structure of FIG. 8 after forming a dielectric capping material on an exposed surface of the metal semiconductor alloy material that is doped with carbon and/or nitrogen in accordance with an embodiment of the present invention.

Referring now to FIG. 9, there is illustrated the structure of FIG. 8 after forming a dielectric capping material 24 on an exposed surface of the metal semiconductor alloy material 32 that is doped with carbon and/or nitrogen in accordance with an embodiment of the present invention. The dielectric capping material 24 employed in this embodiment of the present invention is the same as that mentioned in the previous embodiment of the present invention.

Figure 10:
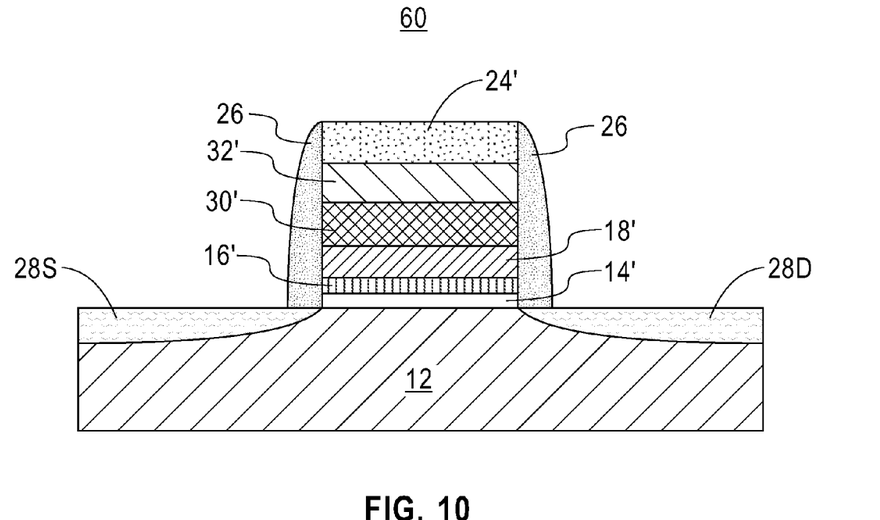
FIG. 10 is a pictorial representation (through a cross sectional view) illustrating the structure of FIG. 9 after patterning the gate material stack to provide a gate structure overlying a portion of the semiconductor substrate, forming at least one gate spacer adjacent the gate structure, and forming a source region on one side of the gate structure and a drain region on opposite side of the gate structure in accordance with an embodiment of the present invention.

Referring now to FIG. 10, there is illustrated the structure of FIG. 9 after patterning the gate material stack to provide a gate structure 60 overlying a portion of the semiconductor substrate 12, forming at least one gate spacer 26 adjacent the gate structure 60, and forming a source region 28S on one side of the gate structure 60 and a drain region 28D on opposite side of the gate structure 60 in accordance with an embodiment of the present invention. Gate structure 60 includes remaining portions of the optional interfacial material 14, the gate dielectric material 16, the electrically conducting material 18, the non-carbon and/or non-nitrogen doped semiconductor-containing material 30, the metal semiconductor alloy material 32, and the dielectric capping material 24. The remaining portion of the optional interfacial material 14 is referred hereinafter as optional interfacial layer 14'. The remaining portion of the gate dielectric material 16 is referred hereinafter as gate dielectric layer 16', the remaining portion of the electrically conducting material 18 is hereinafter referred to as electrically conducting layer 18', the remaining portion of the non-carbon and/or non-nitrogen doped semiconductor-containing material 30 is hereinafter referred to as semiconductor-containing layer 32', the remaining portion of the metal semiconductor alloy material 32 that is doped with carbon and/or nitrogen is hereinafter referred to as metal semiconductor alloy layer 32', and the remaining portion of the dielectric capping material 24 is hereinafter referred to as dielectric capping layer 24'. As shown in the drawings, each of elements 14'. 16', 18', 30', 32' and 24, of gate structure 60 have sidewalls which are vertically coincident to each other.

The patterning, formation of the at least one gate spacer 26 and formation of the source region 28S and drain region 28D that was employed in the previous embodiment can be used in this embodiment of the present invention in forming the semiconductor device shown in FIG. 10.

Figure 11:
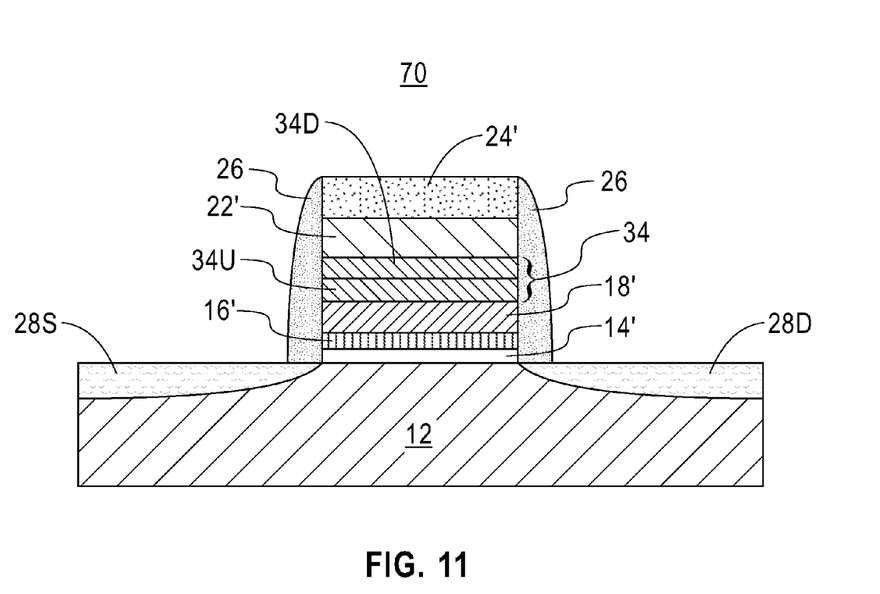
FIG. 11 is a pictorial representation (through a cross sectional view) of one exemplary semiconductor device of the present invention including a gate structure in which a semiconductor-containing layer of a gate structure includes a non-carbon and/or non-nitrogen doped portion and a carbon and/or nitrogen doped portion.

Referring now to FIG. 11, there is illustrated another semiconductor device including a gate structure 70 which includes a semiconductor-containing layer 34 including a portion that is non-carbon and/or non-nitrogen doped 34U and another portion that is doped with carbon and/or nitrogen 34D, in accordance with another embodiment of the present invention. Specifically, the gate structure 70 which is present on a portion of the semiconductor substrate 12 includes, from bottom to top, an optional interfacial layer 14', a gate dielectric layer 16', an electrically conducting layer 18', semiconductor-containing layer 34 including a portion that is non-carbon and/or non-nitrogen doped 34U and another portion that is doped with carbon and/or nitrogen 34D, metal semiconductor alloy layer 22' and dielectric capping layer 24'. Gate spacers 26, source region 28S, and drain region 28D are also present.

The semiconductor device shown in FIG. 11 can be formed utilizing the same basic processing steps as disclosed above in FIGS. 1-6 except for the formation of the semiconductor-containing layer 34. In the embodiment illustrated, and in one example, the semiconductor-containing layer 34 can be formed by depositing, in any order, a carbon and/or nitrogen doped semiconductor-containing material, and a non-carbon and/or non-nitrogen doped semiconductor material. In another embodiment, a deposition process can be used in which carbon and/or nitrogen impurity is introduced in-situ for at least part of the time. In another embodiment, the non-carbon and/or nitrogen doped semiconductor-containing material can be formed by deposition, and thereafter ion implantation, plasma immersion or a cluster beam process can be used to introduce carbon and/or nitrogen impurity into a portion of the non-carbon and/or nitrogen doped semiconductor-containing material.

In some embodiments, and as shown, the portion of the semiconductor-containing layer that is doped with carbon and/or nitrogen 34D has an upper surface that is in direct contact with a bottom surface of the metal semiconductor alloy layer 22'. In another embodiment, this order of doped and non-doped is reversed. In yet another embodiment, a plurality of alternating carbon and/or nitrogen doped semiconductor-containing portions, and non-carbon and/or non-nitrogen doped semiconductor-containing portions can be employed.

Figure 12:
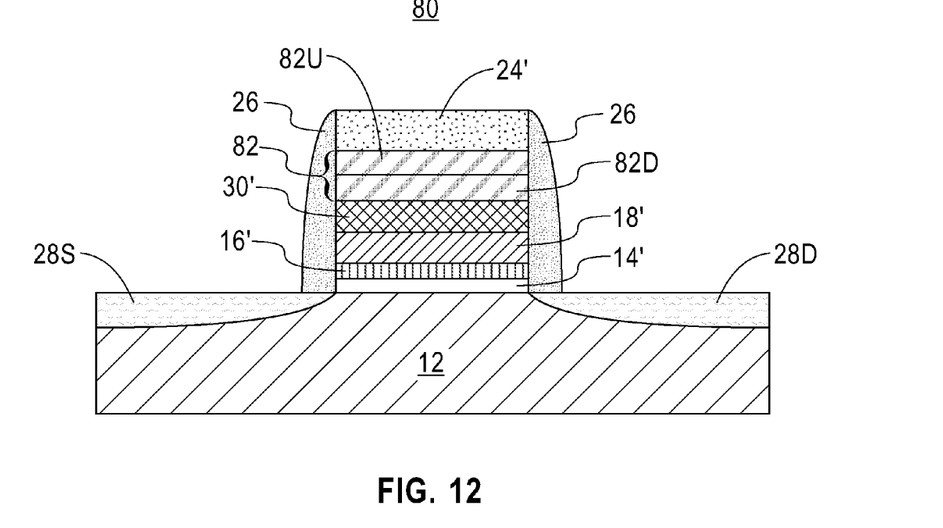
FIG. 12 is a pictorial representation (through a cross sectional view) of another exemplary semiconductor device of the present invention including a gate structure in which a metal semiconductor alloy layer of the gate structure includes a portion that is doped with carbon and/or nitrogen and another portion that is non-carbon and/or non-nitrogen doped.

Referring now to FIG. 12, there is illustrated a semiconductor device including a gate structure 80 which includes a metal semiconductor alloy layer 82 including a portion that is doped with carbon and/or nitrogen 82D and another portion that is non-carbon and/or non-nitrogen doped 82U in accordance with another embodiment of the present invention. Specifically, the gate structure 80 which is present on a portion of the semiconductor substrate 12 includes, from bottom to top, an optional interfacial layer 14', a gate dielectric layer 16', an electrically conducting layer 18', semiconductor-containing layer 30', metal semiconductor alloy layer 82 (including portions 82D and 82U) and dielectric capping layer 24'. Gate spacers 26, source region 28S, and drain region 28D are also present.

The semiconductor device shown in FIG. 12 can be formed utilizing the same basic processing steps as disclosed above in FIGS. 7-10 except that a non-doped metal semiconductor alloy portion can be formed as described above in forming the structure shown in FIG. 3.

In some embodiments, and as shown, the portion of the metal semiconductor alloy layer that is doped with carbon and/or nitrogen 82D has a bottom surface that is in direct contact with an upper surface of the semiconductor-containing layer 30'. In another embodiment, this order of doped and non-doped is reversed. In yet another embodiment, a plurality of alternating carbon and/or nitrogen doped metal semiconductor alloy portions, and non-carbon and/or non-nitrogen doped metal semiconductor alloy portions can be employed.

It is noted that with any of the embodiments of the present invention, it is also possible to have both the semiconductor-containing layer and the metal semiconductor alloy layer include at least one region that is doped with carbon and/or nitrogen.

Figure 13:
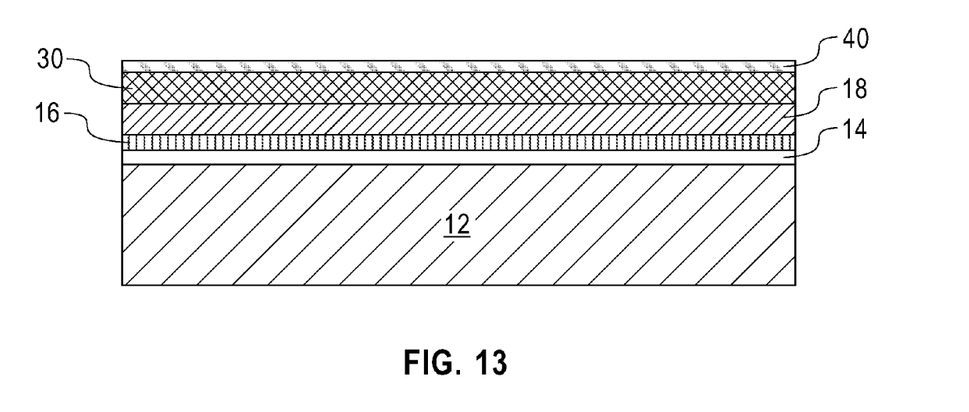
FIG. 13 is a pictorial representation (through a cross sectional view) illustrating the structure of FIG. 7 after forming a layer of carbon and/or nitrogen on an exposed surface of a non-carbon and/or non-nitrogen doped semiconductor-containing material in accordance with an embodiment of the present invention.
Figure 14:
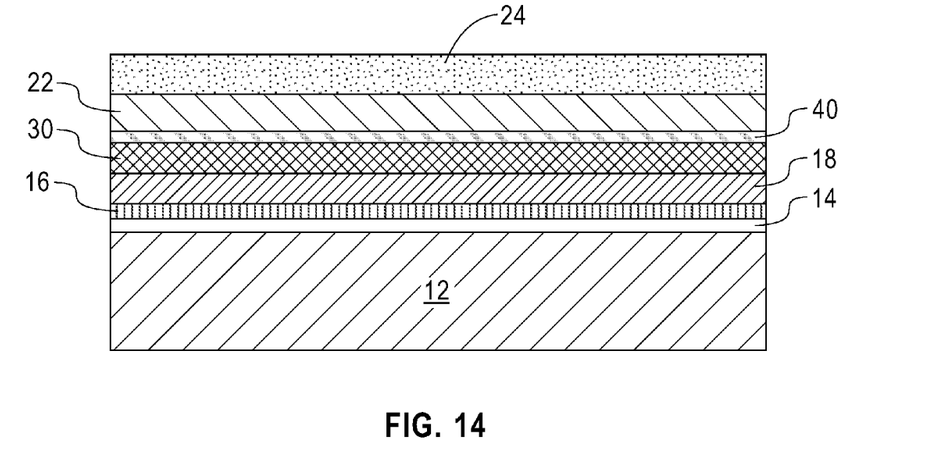
FIG. 14 is a pictorial representation (through a cross sectional view) illustrating the structure of FIG. 13 after forming a metal semiconductor alloy material and a dielectric capping material atop the layer of carbon and/or nitrogen in accordance with an embodiment of the present invention.
Figure 15:
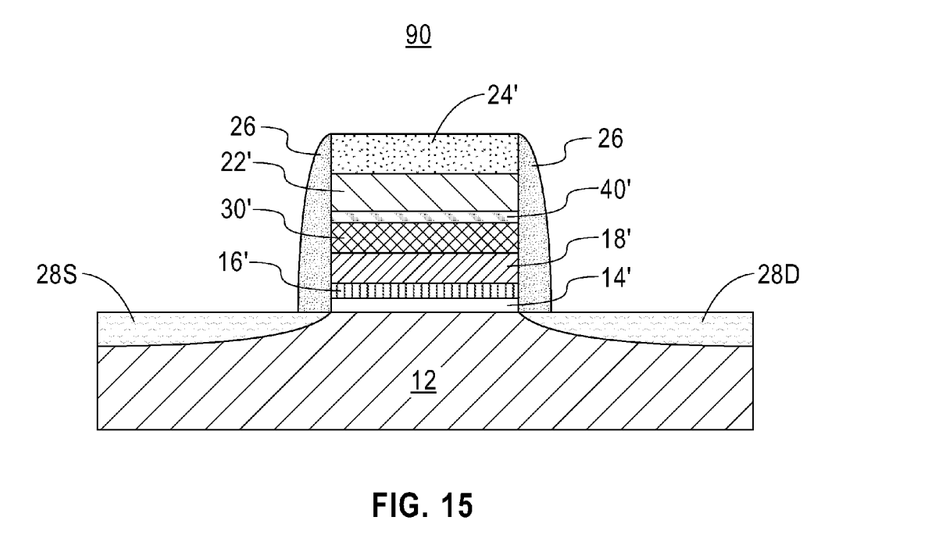
FIG. 15 is a pictorial representation (through a cross sectional view) illustrating the structure of FIG. 14 after patterning the gate material stack to provide a gate structure overlying a portion of the semiconductor substrate, forming at least one gate spacer adjacent the gate structure, and forming a source region on one side of the gate structure and a drain region on opposite side of the gate structure in accordance with an embodiment of the present invention.

Reference is now made to FIGS. 13-15 which illustrate another embodiment of the present invention. In this embodiment, a layer of carbon and/or nitrogen is formed between the semiconductor-containing material and the metal semiconductor alloy material. Although the drawings and description that follow use a non-carbon and/or non-nitrogen doped semiconductor-containing material and a non-carbon and/or non-nitrogen doped metal semiconductor alloy layer, it is possible to also use a semiconductor-containing material that includes at least one region that is doped with carbon and/or nitrogen and/or a metal semiconductor alloy layer that includes at least one region that is doped with carbon and/or nitrogen.

Referring first to FIG. 13, there is illustrated the structure of FIG. 7 after forming a layer of carbon and/or nitrogen 40 on an exposed surface of the non-carbon and/or non-nitrogen doped semiconductor-containing material 30 in accordance with an embodiment of the present invention. The layer of carbon and/or nitrogen 40 can be formed by atomic layer deposition or other like deposition process that is capable of forming a layer of carbon and/or nitrogen. In some embodiments, the layer of carbon and/or nitrogen 40 can be between one hundredth of a monolayer and five monolayers thick. By "monolayer" it is meant to be approximately one atomic layer thick. In another embodiment, the layer of carbon and/or nitrogen can be between one tenth of a monolayer and two monolayers thick.

Referring now to FIG. 14, there is illustrated the structure of FIG. 13 after forming a metal semiconductor alloy material 22 and a dielectric capping material 24 atop the layer of carbon and/or nitrogen 40 in accordance with an embodiment of the present invention. The metal semiconductor alloy material 22 and the dielectric capping material 24 are the same as those described above in conjunction with FIGS. 3 and 4 of the present invention.

Referring now to FIG. 15, there is illustrated the structure of FIG. 14 after patterning the gate material stack shown in FIG. 14 to provide a gate structure 90 overlying a portion of the semiconductor substrate 12, forming at least one gate spacer 26 adjacent the gate structure, and forming a source region 28S on one side of the gate structure 90 and a drain region 28D on opposite side of the gate structure 90 in accordance with an embodiment of the present invention. In this embodiment, gate structure 90 includes, from bottom to top, optional interfacial material 14', gate dielectric layer 16', electrically conducting material 18', semiconductor-containing layer 30', layer of carbon and/or nitrogen 40', and dielectric capping layer 24'.

The patterning, formation of the at least one gate spacer 26 and formation of the source region 28S and drain region 28D that was employed in the previous embodiment can be used in this embodiment of the present invention in forming the semiconductor device shown in FIG. 15.

Although the various embodiments of the present invention illustrate a gate first integration process, the various gate structures of the present invention can be implemented within a gate last process. In such a process, a sacrificial gate material is formed on a surface of a semiconductor substrate. The sacrificial gate material is patterned by lithography and etching forming a sacrificial gate structure. Gate spacers and source/drain regions can then be formed, followed by the formation of a dielectric material adjacent to the sacrificial gate structure. An upper surface of the sacrificial gate structure is exposed and then the sacrificial gate structure is removed by etching forming a gate cavity. One of the above mentioned gate structures can then be formed within the gate cavity.

While the present invention has been particularly shown and described with respect to various embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:
    providing a gate structure on a channel portion of a semiconductor substrate, said gate structure comprises, from bottom to top, a gate dielectric layer, an electrically conducting layer comprising at least one metal that provides a threshold voltage shift to said gate structure, a semiconductor-containing layer, a metal semiconductor alloy layer, and a dielectric capping layer, wherein said gate dielectric layer, said electrically conducting layer, said semiconductor-containing layer, said metal semiconductor alloy layer, and said dielectric capping layer have sidewalls that are vertically coincident to each other, and at least one of said semiconductor layer and said metal semiconductor alloy layer contains at least one of a carbon dopant and a nitrogen dopant; and
    forming at least one gate sidewall spacer adjacent to the gate structure and directly on a surface topmost of the semiconductor substrate, wherein the at least one gate sidewall spacer and the dielectric capping layer encapsulate the metal semiconductor alloy layer within the gate structure.

2. The method of claim 1, wherein said semiconductor-containing layer is doped with at least one of carbon and nitrogen.

3. The method of claim 2, wherein said providing said gate structure comprises forming a semiconductor-containing material utilizing an in-situ deposition process.

4. The method of claim 2, wherein said providing said gate structure comprises depositing a non-carbon and/or non-nitrogen doped semiconductor-containing material and then introducing at least one of carbon and nitrogen into said non-carbon and/or non-nitrogen doped semiconductor-containing material by ion implantation, plasma immersion or a cluster ion beam process.

5. The method of claim 1, wherein said metal semiconductor alloy layer is doped with at least one of carbon and nitrogen.

6. The method of claim 5, wherein said forming the gate structure comprises deposition of metal semiconductor alloy material containing said at least one of carbon and nitrogen.

7. The method of claim 1, wherein said at least one of carbon and nitrogen is present in said semiconductor-containing layer, said metal semiconductor alloy layer, or each of said semiconductor-containing layer and said metal semiconductor alloy layer in an amount from 0.01 to 10 atomic percent.

8. The method of claim 1, wherein a portion of said semiconductor-containing layer is doped with at least one of carbon and nitrogen, and another portion of the semiconductor-containing layer is non-doped, and wherein said portion of said semiconductor-containing layer doped with at least one of carbon and nitrogen has an upper surface in direct contact with a bottom surface of said metal semiconductor alloy layer.

9. The method of claim 1, wherein a portion of said metal semiconductor alloy layer is doped with at least one of carbon and nitrogen, and another portion of the metal semiconductor alloy layer is non-doped, and wherein said portion of said metal semiconductor alloy layer doped with at least one of carbon and nitrogen has a bottom surface in direct contact with an upper surface of said semiconductor-containing layer.

10. A method of forming a semiconductor device comprising:
providing a gate structure on a channel portion of a semiconductor substrate, said gate structure comprises, from bottom to top, a gate dielectric layer, an electrically conducting layer comprising at least one metal that provides a threshold voltage shift to said gate structure, a semiconductor-containing layer, a metal semiconductor alloy layer, and a dielectric capping layer, wherein at least one of said semiconductor layer and said metal semiconductor alloy layer contains a carbon dopant; and
forming at least one gate sidewall spacer adjacent to the gate structure and on a surface of the semiconductor substrate, wherein the at least one gate sidewall spacer and the dielectric capping layer encapsulate the metal semiconductor alloy layer within the gate structure.

11. The method of claim 10, wherein said semiconductor-containing layer is doped with carbon.

12. The method of claim 11, wherein said providing said gate structure comprises forming a semiconductor-containing material utilizing an in-situ deposition process.

13. The method of claim 11, wherein said providing said gate structure comprises depositing a non-carbon doped semiconductor-containing material and then introducing carbon into said non-carbon doped semiconductor-containing material by ion implantation, plasma immersion or a cluster ion beam process.

14. The method of claim 10, wherein said metal semiconductor alloy layer is doped with carbon.

15. The method of claim 14, wherein said forming the gate structure comprises deposition of metal semiconductor alloy material containing said carbon.

16. The method of claim 10, wherein said carbon is present in said semiconductor-containing layer, said metal semiconductor alloy layer, or each of said semiconductor-containing layer and said metal semiconductor alloy layer in an amount from 0.01 to 10 atomic percent.

17. The method of claim 10, wherein a portion of said semiconductor-containing layer is doped with carbon, and another portion of the semiconductor-containing layer is non-doped, and wherein said portion of said semiconductor-containing layer doped with carbon has an upper surface in direct contact with a bottom surface of said metal semiconductor alloy layer.

18. The method of claim 10, wherein a portion of said metal semiconductor alloy layer is doped with carbon, and another portion of the metal semiconductor alloy layer is non-doped, and wherein said portion of said metal semiconductor alloy layer doped with carbon has a bottom surface in direct contact with an upper surface of said semiconductor-containing layer.

* * * * *